United States Patent
Lee et al.

(10) Patent No.: US 9,083,351 B1
(45) Date of Patent: Jul. 14, 2015

(54) PHASE LOCK LOOP WITH TRACKING FILTER FOR ATTENUATING SPURIOUS SIGNALS OF A SWEPT LOCAL OSCILLATOR

(71) Applicant: Raytheon Company, Waltham, MA (US)

(72) Inventors: Jack W. Lee, Sudbury, MA (US); David M. Upton, Sudbury, MA (US); Michael E. Yeomans, Sudbury, MA (US); Marc S. Wald, Sudbury, MA (US); James P. Dumais, Sudbury, MA (US)

(73) Assignee: Raytheon Company, Waltham, MA (US)

( * ) Notice: Subject to any disclaimer, the term of this patent is extended or adjusted under 35 U.S.C. 154(b) by 115 days.

(21) Appl. No.: 13/794,329

(22) Filed: Mar. 11, 2013

(51) Int. Cl.
| H03L 7/00 | (2006.01) |
| H03L 7/02 | (2006.01) |
| H03L 7/12 | (2006.01) |
| H01P 1/20 | (2006.01) |
| H03L 7/093 | (2006.01) |

(52) U.S. Cl.
CPC .. *H03L 7/02* (2013.01); *H03L 7/12* (2013.01); *H01P 1/20* (2013.01); *H03L 7/093* (2013.01)

(58) Field of Classification Search
CPC .............. H01P 1/20; H03L 7/12; H03L 7/093
USPC .............. 331/2, 4, 17, 46; 455/307, 313, 323, 455/260; 375/317, 340, 344, 345
See application file for complete search history.

(56) References Cited

U.S. PATENT DOCUMENTS

| 3,588,752 A | | 6/1971 | Hirshfield et al. |
| 3,668,566 A | | 6/1972 | Trigg et al. |
| 5,783,977 A | * | 7/1998 | Chethik ........................ 333/174 |
| 6,420,916 B1 | | 7/2002 | Freeman et al. |
| 6,453,157 B1 | | 9/2002 | Roberts et al. |
| 6,813,484 B1 | * | 11/2004 | Tolson ........................ 455/307 |
| 7,689,193 B2 | | 3/2010 | Lester et al. |
| 7,982,547 B2 | | 7/2011 | Herzinger |
| 2004/0116091 A1 | * | 6/2004 | McGinn ...................... 455/193.1 |

OTHER PUBLICATIONS

Gocal et al., "Analysis and Design of Tracking Filters", IEEE Transaction on Cir and Sys, Jan. 1980, pp. 45-50.

* cited by examiner

*Primary Examiner* — Arnold Kinkead
(74) *Attorney, Agent, or Firm* — Christie, Parker & Hale, LLP

(57) ABSTRACT

A high spectral purity swept local oscillator including a tracking filter. The output of a swept DDS oscillator may be improved by filtering it with a band-pass filter having an adjustable center frequency, which is adjusted in real time to track the instantaneous frequency of the DDS oscillator. The tracking may be accomplished by comparing, using a phase comparator, the phase at the output of the band-pass filter to the phase at its input, and feeding back to the frequency control input of the band-pass filter a signal corresponding to the phase difference measured by the phase comparator.

16 Claims, 3 Drawing Sheets

PHASE LOCK LOOP WITH TRACKING FILTER FOR ATTENUATING SPURIOUS SIGNALS OF A SWEPT LOCAL OSCILLATOR

BACKGROUND

1. Field

One or more aspects of embodiments according to the present invention relate to swept local oscillators and more particularly to a swept local oscillator system with high spectral purity output.

2. Description of Related Art

Local oscillators are used in numerous radio-frequency applications, for example for frequency translation in a dual conversion receiver. The spectral purity of a local oscillator may have significant consequences for system performance. For example, if the radio frequency (RF) input of a receiver receives a combination of a desired narrow-band signal and undesired broadband noise or interference, the undesired mixing products of the received noise or interference with spectral impurities in the local oscillator may fall in the same intermediate frequency (IF) band as the desired mixing products of the desired received signal and local oscillator signal. Local oscillator spectral impurities may be the result of phase noise or may be spurious spectral components caused by other mechanisms. If a local oscillator employs direct digital synthesis (DDS), for example, spurious spectral components may form as a result of various nonlinear mechanisms, for example in the digital to analog converter (DAC) of the DDS oscillator, where these mechanisms may produce intermodulation products of the clock frequency and its harmonics with the oscillator frequency and its harmonics.

In a swept frequency DDS oscillator the spurious spectral content may be particularly troublesome because its spectrum, relative to the frequency, or instantaneous frequency, of the oscillator will change as the frequency is swept, and the frequencies of the intermodulation products change depending on their order. DDS oscillators have important advantages, however in swept local oscillator applications, including frequency agility. Thus, there is a need for a system using a DDS oscillator to form a high spectral purity swept local oscillator.

SUMMARY

In one embodiment, the output of a swept DDS oscillator may be improved by filtering it with a band-pass filter having an adjustable center frequency, which is adjusted in real time to track the instantaneous frequency of the DDS oscillator. The tracking may be accomplished by comparing, using a phase comparator, the phase at the output of the band-pass filter to the phase at its input, and feeding back a signal, corresponding to the phase difference measured by the phase comparator, to the frequency control input of the band-pass filter.

According to an embodiment of the present invention there is provided a high spectral purity swept local oscillator, including: a swept oscillator having an output and an instantaneous frequency; a band-pass filter having an adjustable center frequency, connected to the output of the swept oscillator; a delay element connected to the output of the swept oscillator; and circuitry providing a control signal to the band-pass filter, the circuitry configured to cause the center frequency of the band-pass filter to be substantially the same as the instantaneous frequency of the swept oscillator, the control signal being a function of the difference between: the phase of a signal at the output of the band-pass filter; and the phase of a signal at the output of the delay element.

In one embodiment, the band-pass filter includes a varactor.

In one embodiment, the swept oscillator is a direct digital synthesis (DDS) oscillator.

In one embodiment, the circuitry includes a loop filter.

In one embodiment, the loop filter includes an operational amplifier circuit configured to provide an adjustable offset.

In one embodiment, the operational amplifier circuit configured to provide an adjustable offset includes a potentiometer, the end terminals of the potentiometer being connected to two different reference voltages.

In one embodiment, the loop filter is a first-order filter.

In one embodiment, the loop filter includes an operational amplifier circuit configured as an integrator.

In one embodiment, the loop filter includes a low-pass filter.

In one embodiment, the circuitry includes: a first power splitter, connected to: an output of the swept oscillator; and an input of the band-pass filter; the first power splitter configured to route a portion of the signal at the output of the swept oscillator to an input of the delay element; a phase comparator, an output of the delay element being connected to an input of the phase comparator; a second power splitter, connected to an output of the band-pass filter, configured to route a portion of the signal at the output of the band-pass filter to the phase comparator; and a loop filter, an output of the phase comparator being connected to an input of the loop filter, an output of the loop filter providing the control signal to the band-pass filter.

In one embodiment, the band-pass filter includes a varactor.

In one embodiment, the swept oscillator is a direct digital synthesis (DDS) oscillator.

In one embodiment, the loop filter includes an operational amplifier circuit configured to provide an adjustable offset.

In one embodiment, the operational amplifier circuit configured to provide an adjustable offset includes a potentiometer, the end terminals of the potentiometer being connected to two different reference voltages.

In one embodiment, the loop filter is a first-order filter.

In one embodiment, the loop filter includes an operational amplifier circuit configured as an integrator.

In one embodiment, the loop filter includes an operational amplifier circuit configured as an integrator.

According to an embodiment of the present invention there is provided a method of generating a high spectral purity swept signal, the method including: receiving an output signal from a swept oscillator having an instantaneous frequency; delaying said output signal to generate a delayed swept oscillator signal; receiving an output signal from a band-pass filter having an adjustable center frequency; generating a control signal; and controlling the center frequency with the control signal to cause the center frequency to be substantially the same as the instantaneous frequency; wherein the generating of the control signal includes generating a phase difference signal proportional to the difference between: the phase of the output signal from the band-pass filter; and the phase of the delayed swept oscillator signal.

In one embodiment, the generating of the control signal further includes filtering the phase difference signal with a loop filter.

In one embodiment, the controlling of the center frequency with the control signal includes providing the control signal as a bias to a varactor.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a phase lock loop with tracking filter for attenuating spurious signals of a swept local oscillator provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
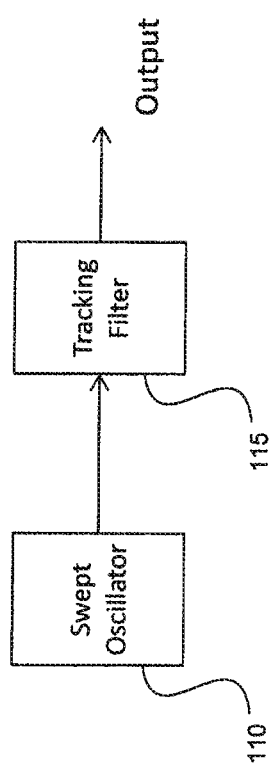
FIG. 1 is a block diagram of a high spectral purity swept local oscillator according to an embodiment of the present invention.

Referring to FIG. 1, in one embodiment, a high spectral purity swept local oscillator may be constructed by connecting in cascade a swept oscillator 110 and a tracking filter 115. If the tracking filter 115 is adjusted so that the frequency of the swept oscillator 110 is within the passband of the tracking filter 115, and if the passband width of the tracking filter 115 is sufficiently small, it may attenuate any spurious spectral components and phase noise of the swept oscillator 110 sufficiently to make the cascade a local oscillator of acceptable spectral purity.

Figure 2:
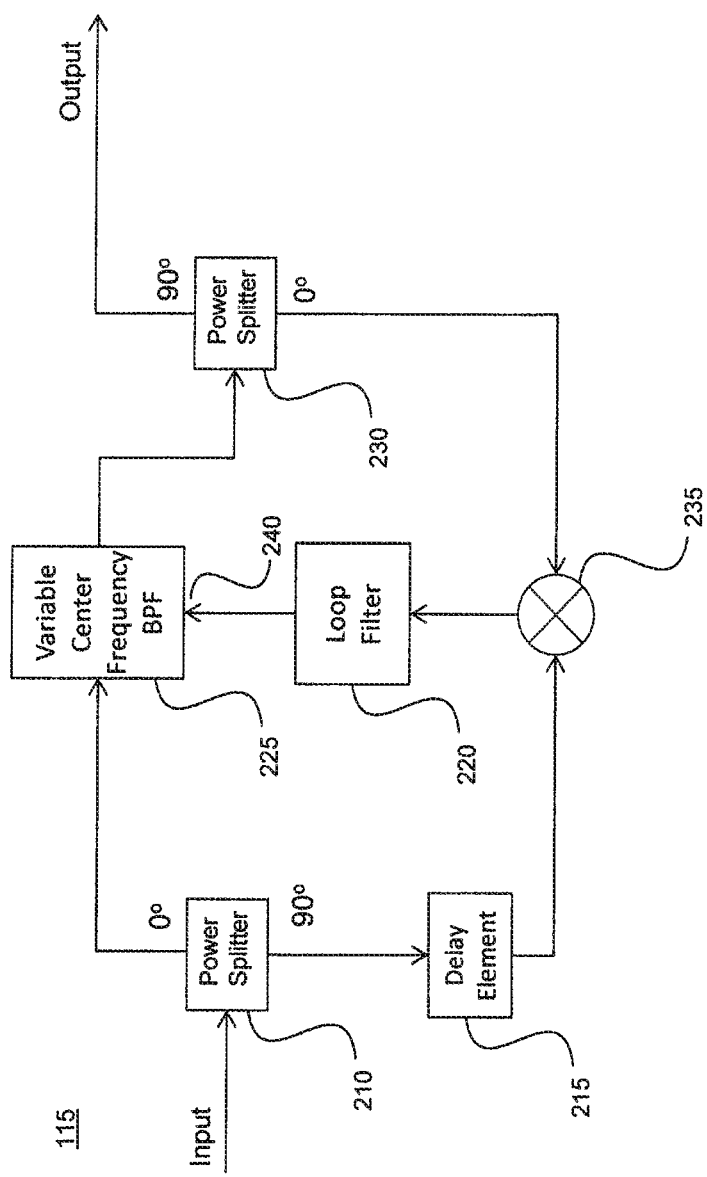
FIG. 2 is a block diagram of a tracking filter according to an embodiment of the present invention.

Referring to FIG. 2, in one embodiment, the tracking filter 115 includes a phase-locked loop (PLL) to control the center frequency of a variable center frequency band-pass filter 225, so that, as the frequency of the swept oscillator 110 changes, the passband of the variable center frequency band-pass filter 225 remains adequately centered on the instantaneous frequency of the swept oscillator 110. The input signal, received from the swept oscillator 110, is split into two portions by a first 90-degree power splitter 210. The portion delayed by 90 degrees propagates through a delay element and to one input of a phase comparator 235. The signal from the other, 0-degree output of the first 90-degree power splitter 210 propagates through a variable center frequency band-pass filter 225 and to a second 90-degree power splitter 230, the 90-degree output of which is the output of the tracking filter 115, and the other output of which is connected to the other input of the phase comparator 235. The output of the phase comparator 235 is filtered by a loop filter 220 and fed to the frequency control input 240 of the variable center frequency band-pass filter 225.

As used herein, two components are said to be "connected" if electrical signals may propagate from one component to the other, either directly through a cable or other conductor, or indirectly, i.e., through other components such as a power splitter. Two components are said to be "directly connected" if electrical signals may propagate directly from one to the other, over a conductor, without propagating through intervening components. Thus, the two inputs of the phase comparator 235 may be said to be connected to the output of the swept oscillator 110, and to the output of the variable center frequency band-pass filter 225, respectively, so that the phase comparator measures a phase difference which is a function of the phase delay through the band-pass filter.

In operation, the phase delay through the variable center frequency band-pass filter 225 depends on the difference between the instantaneous frequency of the swept oscillator 110 and the frequency of the center of the passband of the variable center frequency band-pass filter 225 center, which may be referred to as the center frequency of the band-pass filter. In particular, the phase at the output of the variable center frequency band-pass filter 225 may be increasingly delayed as the oscillator frequency increases relative to the center frequency of the band-pass filter, or, equivalently, as the center frequency of the band-pass filter decreases relative to the oscillator frequency. The output of the phase comparator 235 is affected by the phase delay through the variable center frequency band-pass filter 225, and this output is fed back to the frequency control input 240 of the variable center frequency band-pass filter 225 to keep the center frequency of the band-pass filter substantially the same as the oscillator frequency.

In a simplified case, if the phase delay through the variable center frequency band-pass filter 225 is zero when the oscillator frequency equals the center frequency of the band-pass filter, and if the delay element is selected to provide no delay, then the signals at the two inputs of the phase comparator 235 are 90 degrees out of phase, as a result of the phase delay at the 90-degree output of the first 90-degree power splitter 210. If the output of the phase comparator 235 is zero when the two inputs are 90 degrees out of phase, as is the case if a multiplier is used for the phase comparator 235, then at this operating point the phase comparator 235 output is zero, indicating that no correction is required to the center frequency of the band-pass filter.

If the oscillator frequency increases slightly from this operating point, the phase delay through the variable center frequency band-pass filter 225 increases slightly, resulting in a non-zero, e.g., positive, voltage at the output of the phase comparator 235. If the loop filter 220 is an inverting integrator, then a positive input to the loop filter 220 results in a decreasing voltage at the output of the loop filter 220, which may, if the frequency control input 240 of the variable center frequency band-pass filter 225 is suitably configured, cause the center frequency of the band-pass filter to increase until it again equals the frequency of the swept oscillator 110. In one embodiment, the variable center frequency band-pass filter 225 may contain one or more varactors, the reverse bias on which is increased when the voltage at the frequency control input 240 decreases, resulting in an increase in the center frequency of the band-pass filter. The phase comparator 235 may be a multiplier, such as a double balanced mixer.

In other embodiments, changes may be made to aspects of the design in FIG. 2 which may change the sign of the feedback to the frequency control input 240 of the center frequency of the band-pass filter, provided such changes are made in pairs so that the effect of the control loop, in response to an increase in the oscillator frequency, is to increase the center frequency of the band-pass filter. Examples of such changes include reversing the outputs of both the first 90-degree power splitter 210 and the second 90-degree power splitter 230, using a non-inverting loop filter 220, using an inverting output of the phase comparator 235, or configuring the variable center frequency band-pass filter 225 so that an increase in the voltage at the frequency control input 240 causes the center frequency of the band-pass filter to increase.

Figure 3:
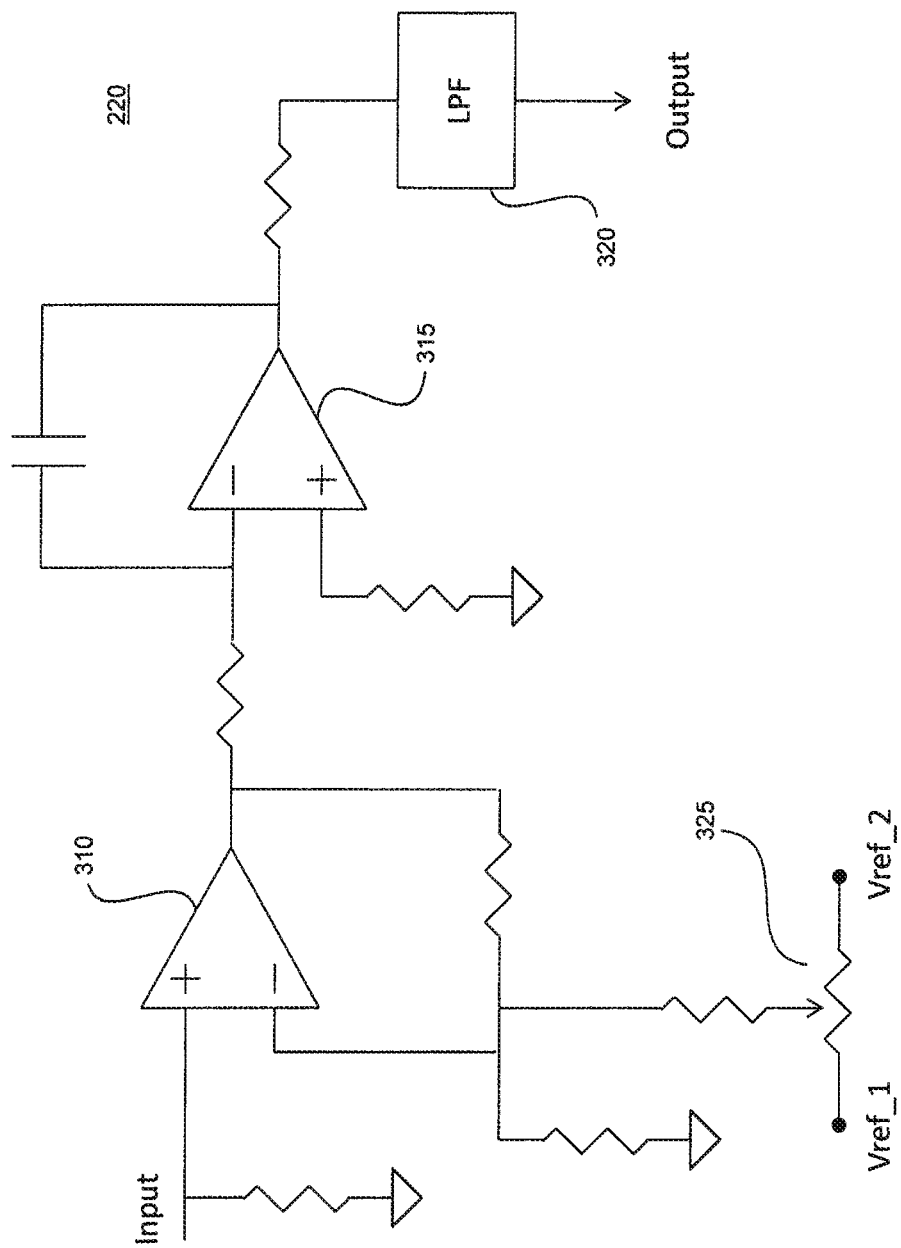
FIG. 3 is a block diagram of a loop filter according to an embodiment of the present invention.

Referring to FIG. 3, in one embodiment, the loop filter 220 includes a first operational amplifier 310 configured as a first, non-inverting, amplifier stage with an adjustable offset, and a second operational amplifier 315 configured as a second, inverting, integrating amplifier stage. The adjustable offset may be implemented using a potentiometer 325 providing a voltage at the wiper terminal of the potentiometer 325 which is adjustable between two different reference voltages provided at the end terminals of the potentiometer 325. The adjustable voltage may be connected to a summing input of the first operational amplifier 310. A low-pass filter 320 may be included in the loop filter 220, to filter out high-frequency noise which otherwise may cause undesired high-frequency phase modulation in the variable center frequency band-pass filter 225, and phase noise at the output of the tracking filter 115.

Both the delay element and the adjustable offset may be selected or adjusted to cause the center frequency of the band-pass filter to track the oscillator instantaneous frequency in the presence of several effects which otherwise might result in a tracking error. Such effects may include a tracking error resulting from tracking a ramp with a first-order loop, any phase shift produced by the variable center frequency band-pass filter 225 at the center of the passband, and any mismatches in the lengths of the two signal paths between the output of the swept oscillator 110 and the phase comparator 235. To facilitate the selection of a delay element providing the correct amount of delay, the delay element may, instead of being soldered into the circuit, be installed in the circuit using connectors, making it possible to substitute a longer or shorter delay with little effort.

A spectrum analyzer may be used to select a delay element and to adjust the offset. For example, if the swept oscillator 110 is configured to generate a constant-amplitude signal with a linear frequency ramp, the power spectrum approximates a flat-topped shape, with a horizontal central portion, i.e., a central portion having constant power spectral density. If the offset is not adjusted correctly, then the center frequency of the band-pass filter may be above, or below, the swept oscillator 110 frequency throughout the sweep, resulting in a reduction in output power; thus the offset may be adjusted so as to maximize the average power at the output of the system. If an incorrect delay element has been selected, having too little or too much delay, then the phase error, and the power at the output of the system, may vary with frequency, resulting in spectrum which has a sloping top. Thus, a delay element may be selected to produce a power spectrum with a flat-top shape having a top that is as horizontal as possible, i.e., different delay elements may be connected into the circuit until the variation of power spectral density with frequency over a central portion of the power spectrum is less than a maximum acceptable amount, i.e., less than a threshold amount.

Although limited embodiments of a phase lock loop with tracking filter for attenuating spurious signals of a swept local oscillator have been specifically described and illustrated herein, many modifications and variations will be apparent to those skilled in the art. Accordingly, it is to be understood that the phase lock loop with tracking filter for attenuating spurious signals of a swept local oscillator employed according to principles of this invention may be embodied other than as specifically described herein. The invention is also defined in the following claims, and equivalents thereof.

What is claimed is:

1. A high spectral purity swept local oscillator, comprising:
a swept oscillator having an output and an instantaneous frequency;
a band-pass filter having an adjustable center frequency, connected to the output of the swept oscillator;
a delay element connected to the output of the swept oscillator; and
circuitry providing a control signal to the band-pass filter, the circuitry configured to cause the center frequency of the band-pass filter to be substantially the same as the instantaneous frequency of the swept oscillator,
the control signal being a function of the difference between:
the phase of a signal at the output of the band-pass filter; and
the phase of a signal at the output of the delay element,
wherein the circuitry comprises a loop filter, and
wherein the loop filter comprises an operational amplifier circuit configured to provide an adjustable offset.

2. The swept local oscillator of claim 1, wherein the band-pass filter comprises a varactor.

3. The swept local oscillator of claim 1, wherein the swept oscillator is a direct digital synthesis (DDS) oscillator.

4. The swept local oscillator of claim 1, wherein the operational amplifier circuit configured to provide an adjustable offset comprises a potentiometer, the end terminals of the potentiometer being connected to two different reference voltages.

5. The swept local oscillator of claim 1, wherein the loop filter is a first-order filter.

6. The swept local oscillator of claim 1, wherein the loop filter comprises an operational amplifier circuit configured as an integrator.

7. The swept local oscillator of claim 1, wherein the loop filter comprises a low-pass filter.

8. A high spectral purity swept local oscillator, comprising:
a swept oscillator having an output and an instantaneous frequency;
a band-pass filter having an adjustable center frequency, connected to the output of the swept oscillator;
a delay element connected to the output of the swept oscillator; and
circuitry providing a control signal to the band-pass filter, the circuitry configured to cause the center frequency of the band-pass filter to be substantially the same as the instantaneous frequency of the swept oscillator,
the control signal being a function of the difference between:
the phase of a signal at the output of the band-pass filter; and
the phase of a signal at the output of the delay element,
wherein the circuitry comprises:
a first power splitter, connected to:
an output of the swept oscillator; and
an input of the band-pass filter;
the first power splitter configured to route a portion of the signal at the output of the swept oscillator to an input of the delay element;
a phase comparator, an output of the delay element being connected to an input of the phase comparator;
a second power splitter, connected to an output of the band-pass filter, configured to route a portion of the signal at the output of the band-pass filter to the phase comparator; and
a loop filter, an output of the phase comparator being connected to an input of the loop filter, an output of the loop filter providing the control signal to the band-pass filter.

9. The swept local oscillator of claim 8, wherein the band-pass filter comprises a varactor.

10. The swept local oscillator of claim 8, wherein the swept oscillator is a direct digital synthesis (DDS) oscillator.

11. The swept local oscillator of claim 8, wherein the loop filter comprises an operational amplifier circuit configured to provide an adjustable offset.

12. The swept local oscillator of claim 11, wherein the operational amplifier circuit configured to provide an adjustable offset comprises a potentiometer, the end terminals of the potentiometer being connected to two different reference voltages.

13. The swept local oscillator of claim 8, wherein the loop filter is a first-order filter.

14. The swept local oscillator of claim 8, wherein the loop filter comprises an operational amplifier circuit configured as an integrator.

15. A method of generating a high spectral purity swept signal, the method comprising:
   receiving an output signal from a swept oscillator having an instantaneous frequency;
   delaying said output signal to generate a delayed swept oscillator signal;
   receiving an output signal from a band-pass filter having an adjustable center frequency;
   generating a control signal; and
   controlling the center frequency with the control signal to cause the center frequency to be substantially the same as the instantaneous frequency;
   wherein the generating of the control signal comprises generating a phase difference signal proportional to the difference between:
      the phase of the output signal from the band-pass filter; and
      the phase of the delayed swept oscillator signal,
   wherein the generating of the control signal further comprises filtering the phase difference signal with a loop filter comprising an operational amplifier circuit configured to provide an adjustable offset.

16. The method of claim 15, wherein the controlling of the center frequency with the control signal comprises providing the control signal as a bias to a varactor.

* * * * *